(12) United States Patent
Kim

(10) Patent No.: US 9,318,469 B2
(45) Date of Patent: Apr. 19, 2016

(54) STACK PACKAGE AND SYSTEM-IN-PACKAGE INCLUDING THE SAME

(71) Applicant: SK hynix Inc., Gyeonggi-do (KR)

(72) Inventor: Sang-Hwan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/570,888

(22) Filed: Dec. 15, 2014

(65) Prior Publication Data

US 2016/0071823 A1    Mar. 10, 2016

(30) Foreign Application Priority Data

Sep. 5, 2014   (KR) .................. 10-2014-0119158

(51) Int. Cl.
*G05F 1/10* (2006.01)
*H01L 25/065* (2006.01)
*G05F 3/02* (2006.01)

(52) U.S. Cl.
CPC .............. *H01L 25/0657* (2013.01); *G05F 3/02* (2013.01)

(58) Field of Classification Search
CPC .............................. G11C 5/14; H01L 25/0657
See application file for complete search history.

(56) References Cited

U.S. PATENT DOCUMENTS

| 7,569,923 B2* | 8/2009 | Meir | G11C 29/883 257/690 |
| 7,688,665 B2* | 3/2010 | Kim | H01L 23/50 365/189.02 |
| 7,768,114 B2* | 8/2010 | Choi | H01L 25/0657 257/306 |

FOREIGN PATENT DOCUMENTS

| KR | 1020080090844 | 10/2008 |
| KR | 1020140010554 | 1/2014 |

* cited by examiner

*Primary Examiner* — Jeffrey Zweizig
(74) *Attorney, Agent, or Firm* — IP & T Group LLP

(57) ABSTRACT

A system-in-package includes first and second semiconductor chips disposed in a first region over a substrate, and a controller disposed in a second region over the substrate and selectively supplying a power supply voltage to the first or second semiconductor chip based on a data output operation of the first and second semiconductor chips, wherein each of the first and second semiconductor chips includes a first power supply region coupled with the controller through a first line and receiving the power supply voltage from the controller in common during an input/output operation of the first and second semiconductor chips, an output driver suitable for outputting data, and a second power supply region independently coupled with the controller through one of a second line and a third line and independently receiving the power supply voltage for an operation of the output driver from the controller during the data output operation.

22 Claims, 3 Drawing Sheets

STACK PACKAGE AND SYSTEM-IN-PACKAGE INCLUDING THE SAME

CROSS-REFERENCE TO RELATED APPLICATIONS

The present application claims priority of Korean Patent Application No. 10-2014-0119158, filed on Sep. 5, 2014, which is incorporated herein by reference in its entirety.

BACKGROUND

1. Field

Exemplary embodiments of the present invention relate to a semiconductor design technology, and more particularly, to a stack package including a plurality of semiconductor chips having an output driver coupled with an output pad and a pad for supplying a power to the output driver, and a system-in-package including the stack package.

2. Description of the Related Art

In the electronics industry, demands for ultra-compact semiconductor memories with large data storage capacity is increasing with the development of lighter, smaller, faster, and higher performance multi-functional mobile products. In general, there are two solutions to the demand for large-capacity semiconductor memories. One is to increase the integration degree of semiconductor memory chips included in the semiconductor memories, and the other is to assemble multiple semiconductor memory chips into a single semiconductor package. It takes a lot of effort, money, and time to increase the Integration degree of semiconductor memory chips. In contrast, large capacity semiconductor memories may be realized by simply changing how the semiconductor memory chips are assembled. That is, combining multiple memories into a single semiconductor package. This method has many advantages in terms of production cost and development time and effort. Accordingly, the Multi-Chip Package (MCP) technique for mounting and assembling a plurality of semiconductor memory chips into a single semiconductor package is widely used to improve the data storage capacity of semiconductor memories.

A multi-chip package may be fabricated using diverse methods. For example, stack packages fabricated by vertically stacking a plurality of semiconductor chips have been widely used because the stack package technique has advantages of low fabrication cost and suitability for mass production.

In general, the stack packages are formed of one or more semiconductor chips. Since the stack packages are limited by a certain number package pins, input/output pads of the semiconductor chips have to be coupled with the same input/output channel.

When the number of semiconductor chips stacked in a single stack package increases, parasitic capacitance of package pins also increases. This parasitic capacitance may hinder the high-speed operation of input/output pads operating at a high speed.

SUMMARY

Exemplary embodiments of the present invention are directed to a stack package that may decrease loading time of a data input/output pad by independently supplying power to output drivers included in a plurality of semiconductor chips, respectively, and a system-in-package including the stack package.

In accordance with an embodiment of the present invention, a system-in-package may include first and second semiconductor chips disposed in a first region over a substrate, and a controller disposed in a second region over the substrate and suitable for selectively supplying a power supply voltage to the first or second semiconductor chip based on a data output operation of the first and second semiconductor chips, wherein each of the first and second semiconductor chips may include a first power supply region coupled with the controller through a first line and receiving the power supply voltage from the controller in common during an input/output operation of the first and second semiconductor chips, an output driver suitable for outputting data, and a second power supply region independently coupled with the controller through one of a second line and a third line and independently receiving the power supply voltage for an operation of the output driver from the controller during the data output operation of the first or second semiconductor chips.

The controller includes a control portion suitable for performing supply control to provide the first and second semiconductor chips with first and second chip enable signals and selectively supply the power supply voltage to the second power supply region of the first semiconductor chip or the second semiconductor chip, and a power supply portion suitable for selectively supplying the power supply voltage to the second power supply region of the first semiconductor chip or the second semiconductor chip under the supply control of the control portion.

The control portion may include a control signal generation block suitable for generating a control signal for performing the supply control to supply the power supply voltage to the first power supply region and the second power supply region in response to first and second pre-chip enable signals, wherein the control signal generation block may include a first control signal generation unit suitable for generating a first control signal to supply the power supply voltage to the first power supply regions of the first and second semiconductor chips through the first line in common in response to the first or second pre-chip enable signal, a second control signal generation unit suitable for generating a second control signal to supply the power supply voltage to the second power supply region of the first semiconductor chip in response to the first pre-chip enable signal, and a third control signal generation unit suitable for generating a third control signal to supply the power supply voltage to the second power supply region of the second semiconductor chip in response to the second pre-chip enable signal.

The first to third control signals may maintain enabling sections for a predetermined time after the first and second pre-chip enable signals are disabled.

The first to third control signals may be enabled prior to the first and second chip enable signals.

The control portion may further include a rising delay block suitable for delaying rising edges of the first and second pre-chip enable signals and generating the first and second chip enable signals.

Each of the first and second chips may further include a chip enable pad suitable for receiving a corresponding one of the first and second chip enable signals, and an input/output pad suitable for receiving and outputting the data.

The chip enable pad may be independently coupled with the controller through one of a fourth line and a fifth line, and the input/output pad is coupled with the controller through a sixth line.

The second semiconductor chip may be disposed over the first semiconductor chip, and wherein the chip enable pad, the input/output pad and the first power supply region of the first semiconductor chip are exposed.

The number of the input/output pad may correspond to the number of the data.

The first to sixth lines may electrically connect the first and second semiconductor chips to the controller.

The output driver may include a pre-driver block suitable for generating a pull-up signal and a pull-down signal for controlling a data skew rate and a data duty cycle, and an output driver block suitable for outputting the data through the input/output pad.

In accordance with another embodiment of the present invention, a stack package may include first and second semiconductor chips stacked over a substrate, wherein the first semiconductor chip may include a first chip enable pad suitable for receiving a first chip enable signal, a first input/output pad suitable for receiving and outputting data, a first output driver suitable for outputting the data, and a first output pad suitable for supplying a power supply voltage to the first output driver, and the second semiconductor chip may include a second chip enable pad suitable for receiving a second chip enable signal, a second input/output pad suitable for receiving and outputting the data, a second output driver suitable for outputting the data, and a second output pad suitable for supplying the power supply voltage to the second output driver, wherein the first and second chip enable pads may be separately coupled with an external device through a first line and a second line, respectively, and the first and second input/output pads are coupled with each other through a third line, and the first and second output pads are separately coupled with the external device through a fourth line and a fifth line, respectively.

The second semiconductor chip may be disposed over the first semiconductor chip, and wherein the first chip enable pad, the first input/output pad and the first output pad of the first semiconductor chip are exposed.

The number of the first input/output pad and the number of the second input/output pad may correspond to the number of the data.

The first semiconductor chip may further include a first power supply pad for receiving the power supply voltage from the external device during an input/output operation of the data, and the second semiconductor chip further includes a second power supply pad for receiving the power supply voltage during the input/output operation of the data, and the first and second power supply pads are coupled with each other through a sixth line.

The first and second output drivers may independently operate based on the power supply voltage supplied through the first output pad or the power supply voltage supplied through the second output pad.

In accordance with another embodiment of the present invention, a stack package may include a plurality of semiconductor chips stacked over a substrate, wherein each of the semiconductor chips may include a plurality of semiconductor chips stacked over a substrate, wherein each of the semiconductor chips may include a chip enable pad suitable for receiving a chip enable signal, an input/output pad suitable for receiving and outputting data, an output driver suitable for outputting the data and an output pad suitable for supplying a power supply voltage to the output driver, wherein the output pads may include in the semiconductor chips are separately coupled with an external device through a plurality of lines, respectively.

The semiconductor chips may be stacked in tiers over the substrate.

The number of the input/output pads may correspond to the number of the data.

In accordance with another embodiment of the present invention, a system-in-package includes first and second semiconductor chips including first power supply regions, respectively, and including second power supply regions, respectively, and a controller suitable for supplying a power supply voltage to the first power supply regions in common during data input/output operations of the first and second semiconductor chips and independently supplying the power supply voltage to the second power supply regions during respective data output operations of the first or second semiconductor chips.

The first power supply regions may be coupled with the controller through a common line and the second power supply regions are separately coupled with the controller through respective lines.

DETAILED DESCRIPTION

Figure 1:
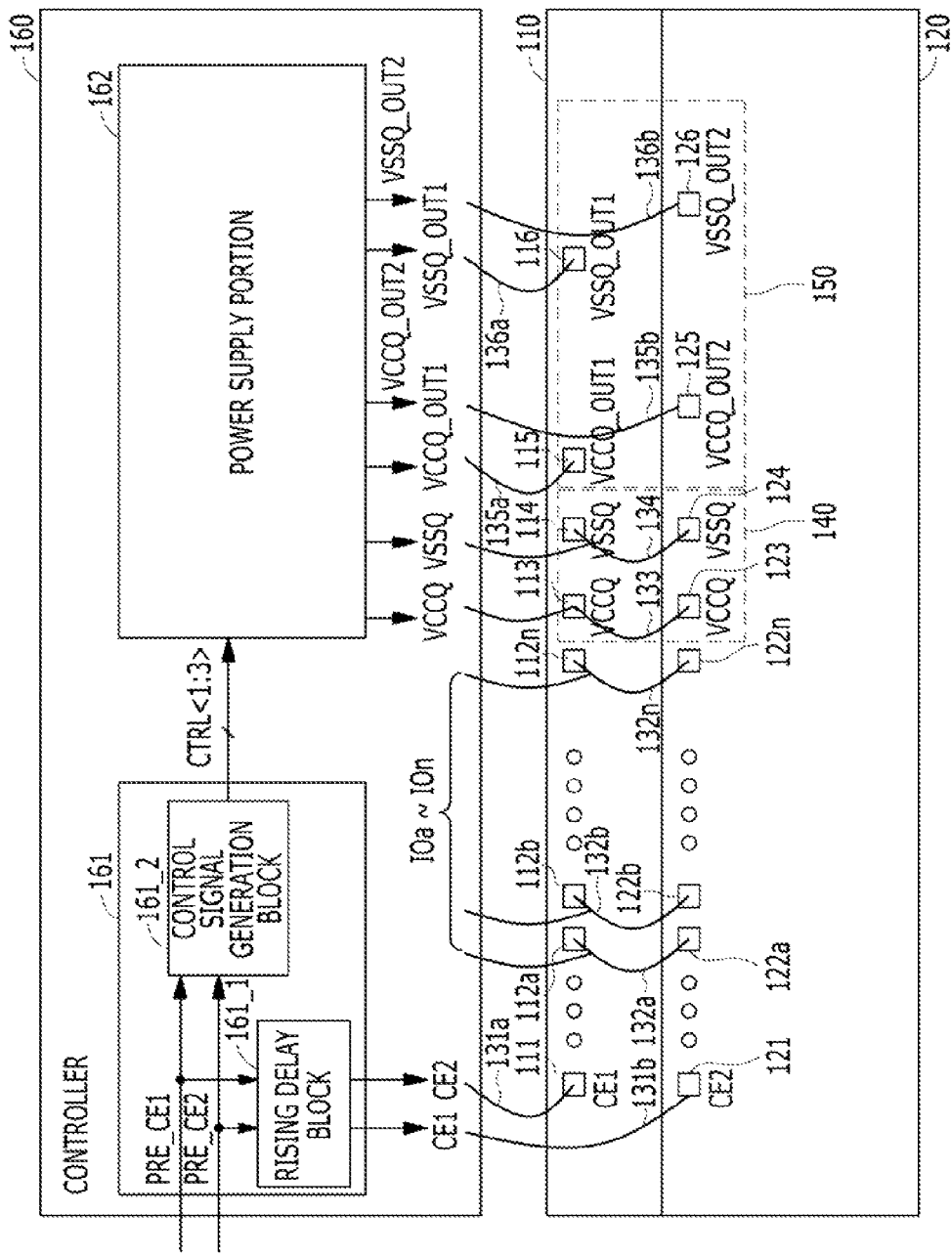
FIG. 1 is a diagram illustrating a system-in-package in accordance with an embodiment of the present invention.

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate. Throughout the disclosure, like reference numerals refer to like parts throughout the various figures and embodiments of the present invention.

FIG. 1 is a diagram illustrating a system-in-package in accordance with an embodiment of the present invention.

Referring to FIG. 1, a system-in-package may include a first semiconductor chip 110 and a second semiconductor chip 120 that are sequentially stacked over a first region of a substrate (not shown), and a controller 160 disposed over a second region of the substrate. Although the first and second semiconductor chips 110 and 120 are described as flash memory chips in one embodiment of the present invention, they may be different types of memory chips in another embodiment.

The first semiconductor chip 110 may include a first chip enable pad 111, a plurality of first input/output pads 112*a*, 112b, . . . , and 112n, first power supply pads 113 and 114, first output pads 115 and 116, and a first output driver (not shown) formed within.

Similarly, the second semiconductor chip 120 may include a second chip enable pad 121, a plurality of second input/output pads 122a, 122b, . . . , and 122n, second power supply pads 123 and 124, second output pads 125 and 126, and a second output driver (not shown) formed within.

The first chip enable pad 111 and the second chip enable pad 121 receive a first chip enable signal CE1 and a second chip enable signal CE2 for enabling the first semiconductor chip 110 and the second semiconductor chip 120, respectively. The first chip enable signal CE1 and the second chip enable signal CE2 may be transmitted from the controller 160. The first chip enable pad 111 and the second chip enable pad 121 may be electrically connected to the controller 160 through bonding wires 131a and 131b, respectively. Although the bonding wires are used as a connection means in this embodiment, lines other than the bonding wires may be used as the connection means in other embodiments and be applied in the same manner in other embodiments.

The first input/output pads 112a, 112b, . . . , and 112n and the second input/output pads 122a, 122b, . . . , and 122n are pads for inputting and outputting data input/output signals IOa to IOn to and from the first semiconductor chip 110 and the second semiconductor chip 120, respectively. The first input/output pads 112a, 112b, . . . , and 112n and the second input/output pads 122a, 122b, . . . , and 122n are coupled with each other through bonding wires 132a, 132b, . . . , and 132n. To be specific, the first input/output pad 112a and the second input/output pad 122a may be electrically connected to each other through the bonding wire 132a. Such a connection method may be applied to the other first input/output pads 112b, . . . , and 112n and second input/output pads 122b, . . . , and 122n, and thus, the other first input/output pads 112b, . . . , and 112n and second input/output pads 122b, . . . , and 122n may be also electrically connected to each other through the bonding wires 132b, . . . , and 132n. Consequently, the data input/output signals IOa to IOn are inputted from the controller 160 to the first semiconductor chip 110 and the second semiconductor chip 120 through the bonding wires 132a to 132n together.

The first semiconductor chip 110 and the second semiconductor chip 120 may receive power from the controller 160 to a first power supply region 140 and a second power supply region 150, respectively.

The first power supply region 140 includes the first power supply pads 113 and 114 and the second power supply pads 123 and 124 for receiving a power source voltage VCCQ and a ground voltage VSSQ that are used in an IO block where the data input/output signals IOa to IOn are inputted/outputted from/to the controller 160. The first power supply pads 113 and 114 and the second power supply pads 123 and 124 are electrically connected to the controller 160 through bonding wires 133 and 134. In other words, the power supply voltage VCCQ may be inputted form the controller 160 to the first and second power supply pads 113 and 123 in common through the bonding wire 133, and the ground voltage VSSQ may be inputted from the controller 160 to the first and second power supply pads 114 and 124 in common through the bonding wire 134.

The second power supply region 150 may include the first output pads 115 and 116 and the second output pads 125 and 126 for receiving first output power supply voltages VCCQ_OUT1 and VSSQ_OUT1 and second output power supply voltages VCCQ_OUT2 and VSSQ_OUT2, for an operation of the output driver formed inside the first semiconductor chip 110 and the second semiconductor chip 120, from the controller 160. The first output pads 115 and 116 may be electrically connected to the controller 160 through bonding wires 135a and 136a, respectively, and the second output pads 125 and 126 may be electrically connected to the controller 160 through bonding wires 135b and 136b, respectively. For example, when the data is outputted from only the first semiconductor chip 110, the first output power supply voltages VCCQ_OUT1 and VSSQ_OUT1 may be supplied to the first output pads 115 and 116. This means that power is supplied to the output driver of the first semiconductor chip 110 where the data is outputted between the first semiconductor chip 110 and second semiconductor chip 120 while it is cut off from the output driver of the second semiconductor chip 120.

In other words, the controller 160 may selectively supply the first output power supply voltages VCCQ_OUT1 and VSSQ_OUT1 or the second output power supply voltages VCCQ_OUT2 and VSSQ_OUT2 through the first output pads 115 and 116 or the second output pads 125 and 126, which are separately coupled with the controller 160 based on a data output operation of the first semiconductor chip 110 or the second semiconductor chip 120. For this operation, the controller 160 may include a control portion 161 and a power supply portion 162.

The control portion 161 may include a rising delay block 161_1 and a control signal generation block 161_2. The rising delay block 161_1 may generate the first chip enable signal CE1 and the second chip enable signal CE2 by delaying rising edges thereof in response to a first pre-chip enable signal PRE_CE1 and a second pre-chip enable signal PRE_CE2. The generated first chip enable signal CE1 and second chip enable signal CE2 may be transmitted based on an operation of the first semiconductor chip 110 or the second semiconductor chip 120.

The control signal generation block 161_2 may generate a plurality of control signals CTRL<1:3> in response to the first pre-chip enable signal PRE_CE1 and the second pre-chip enable signal PRE_CE2. The control signals CTRL<1:3> may be used to perform supply control to supply the power from the power supply portion 162 to the first power supply region 140 and the second power source region 150 of the first semiconductor chip 110 and the second semiconductor chip 120.

Among the control signals CTRL<1:3>, the first control signal CTRL1 may be enabled to supply the power to the first power supply region 140 in common when either the first pre-chip enable signal PRE_CE1 or the second pre-chip enable signal PRE_CE2 is enabled.

The control signal generation block 161_2 may control the power supply portion 162 to selectively supply the first output power supply voltages VCCQ_OUT1 and VSSQ_OUT1 or the second output power supply voltages VCCQ_OUT2 and VSSQ_OUT2 to the second power supply region 150 of the corresponding semiconductor chip where the data is outputted among the first semiconductor chip 110 and the second semiconductor chip 120. For this, the control signal generation block 161_2 may generate the second control signal CTRL2 to supply the first output power supply voltages VCCQ_OUT1 and VSSQ_OUT1 to the second power supply region 150 of the first semiconductor chip 110 and the third control signal CTRL3 to supply the second output power supply voltages VCCQ_OUT2 and VSSQ_OUT2 to the second power supply region 150 of the second semiconductor chip 120 among the control signals CTRL<1:3>. A detailed description thereon is provided below with reference to FIG. 2.

The power supply portion 162 may supply the power supply voltage VCCQ and the ground voltage VSSQ to the first power supply region 140 of the first semiconductor chip 110 and the second semiconductor chip 120 and selectively supply the first output power supply voltages VCCQ_OUT1 and VSSQ_OUT1 or the second output power supply voltages VCCQ_OUT2 and VSSQ_OUT2 to the second power supply region 150 in response to the control signals CTRL<1:3>. The power supply portion 162 may supply the power supply voltage VCCQ and the ground voltage VSSQ in response to the first control signal CTRL1 and perform a switching operation for selectively outputting the first output power supply voltages VCCQ_OUT1 and VSSQ_OUT1 or the second output power supply voltages VCCQ_OUT2 and VSSQ_OUT2 in response to the second control signal CTRL2 or the third control signal CTRL3. A switching element (not shown) for the switching operation may be an NMOS transistor or a PMOS transistor.

According to conventional technology, when a plurality of semiconductor chips are stacked, output pads for supplying power to an output driver included in each of the semiconductor chips are coupled with a controller through a single bonding wire. Although data is outputted in one semiconductor chip among the semiconductor chips, the power is supplied in common to the output drivers of the stacked semiconductor chips. For this reason, the output speeds of data signals decrease due to parasitic capacitance caused by transistors included in the output drivers.

However, in the embodiments of the present invention, as the controller 160 performs supply control to selectively supply power to output drivers included in the semiconductor chips, e.g., the first semiconductor chip 110 and the second semiconductor chip 120, the parasitic capacitance may decrease, and the output speed of the data input/output signals IOa to IOn may be prevented from decreasing.

Although the structure where two semiconductor chips are stacked is described in an embodiment, two or more semiconductor chips may be stacked, and thus bonding wires for independently controlling an output power supply voltage supplied to an output pad included in each of the semiconductor chips may be separately coupled with the controller 160. Also, as the number of the stacked semiconductor chips increases, the number of the control signals for controlling an output power supply voltage supplied to the second power supply region 150 of each semiconductor chip may increase corresponding to the number of the semiconductor chips.

Figure 2:
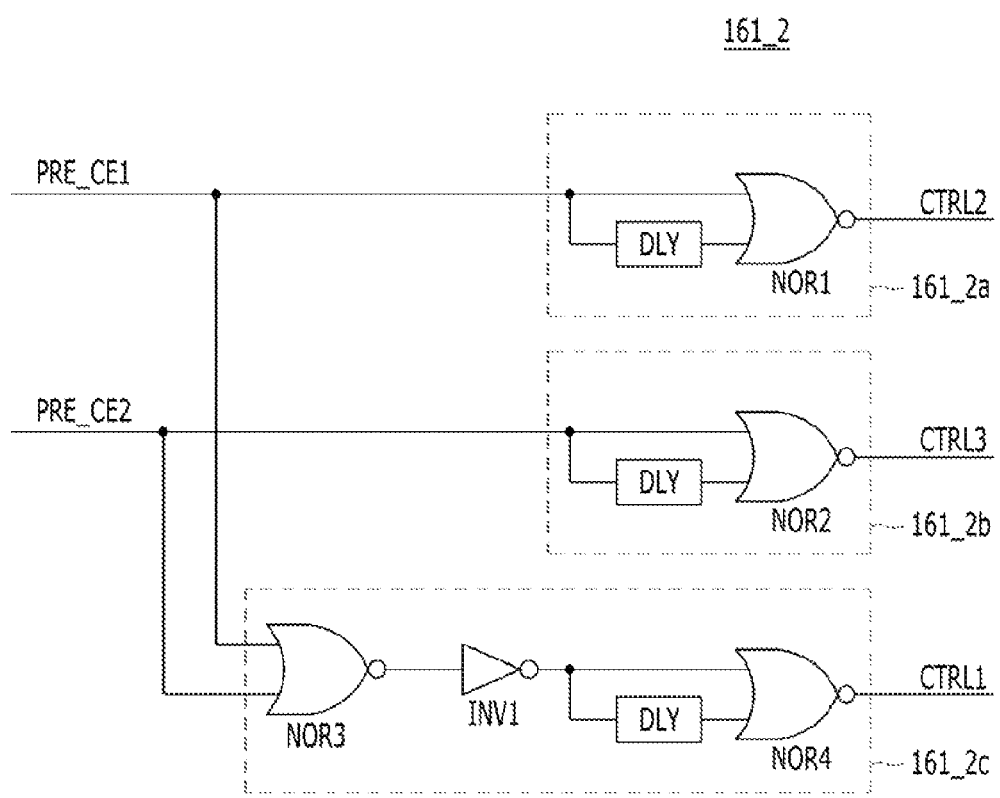
FIG. 2 is a circuit diagram illustrating a control signal generation block shown in FIG. 1.

FIG. 2 is a circuit diagram illustrating a control signal generation block shown in FIG. 1.

Referring to FIGS. 1 and 2, the control signal generation block 161_2 may include a first control signal generation unit 161_2c, a second control signal generation unit 161_2a and a third control signal generation unit 161_2b.

The first control signal generation unit 161_2c may generate the first control signal CTRL1 for performing supply control to supply the power supply voltage VCCQ and the ground voltage VSSQ to the first power supply region 140 of the first and second semiconductor chips 110 and 120 in common in response to the first pre-chip enable signal PRE_CE1 and the second pre-chip enable signal PRE_CE2. In other words, when either the first pre-chip enable signal PRE_CE1 or the second pre-chip enable signal PRE_CE2 is enabled, the first control signal CTRL1 is enabled so that the power supply voltage VCCQ and the ground voltage VSSQ may be supplied to the first and second semiconductor chips 110 and 120.

The second control signal generation unit 161_2a may generate the second control signal CTRL2 for performing supply control to supply the first output power supply voltages VCCQ_OUT1 and VSSQ_OUT1 to the first output pads 115 and 116 of the first semiconductor chip 110 in response to the first pre-chip enable signal PRE_CE1. In other words, when the first pre-chip enable signal PRE_CE1 is enabled while an output operation is performed in the first semiconductor chip 110, the second control signal CTRL2 is enabled so that the first output power supply voltages VCCQ_OUT1 and VSSQ_OUT1 may be controlled to be supplied to the first output pads 115 and 116 of the first semiconductor chip 110.

The third control signal generation unit 161_2b may generate the third control signal CTRL 3 for performing supply control to supply the second output power supply voltages VCCQ_OUT2 and VSSQ_OUT2 to the second output pads 125 and 126 of the second semiconductor chip 120 in response to the second pre-chip enable signal PRE_CE2. In other words, when the second pre-chip enable signal PRE_CE2 is enabled while an output operation is performed in the second semiconductor chip 120, the third control signal CTRL3 is enabled so that the second output power supply voltages VCCQ_OUT2 and VSSQ_OUT2 may be controlled to be supplied to the second output pads 125 and 126 of the second semiconductor chip 120.

The first to third control signal generation units 161_2c, 161_2a and 161_2b include delayers DLY and NOR gates NOR4, NOR1 and NOR2, respectively. This is because an enabling section has to be maintained during a predetermined time for the stability of power supply even after the first and second pre-chip enable signals PRE_CE1 and PRE_CE2 are disabled. Therefore, the first to third control signals CTRL1, CTRL2 and CTRL3 may maintain enabling sections during a predetermined time even after the first and second pre-chip enable signals PRE_CE1 and PRE_CE2 are disabled.

Figure 3:
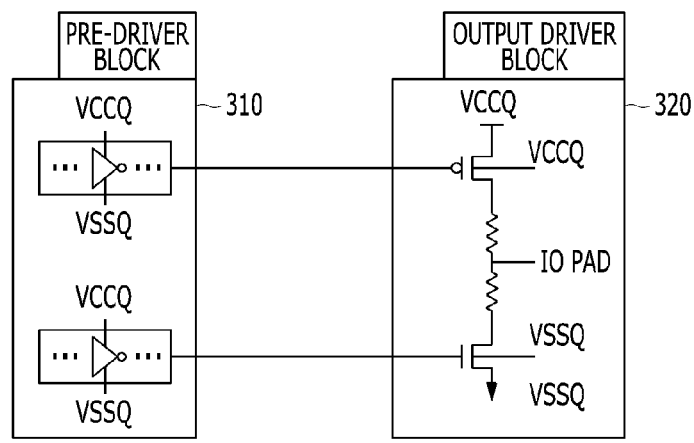
FIG. 3 is a circuit diagram illustrating an output driver included in each of a first semiconductor chip and a second semiconductor chip shown in FIG. 1.

FIG. 3 is a circuit diagram illustrating an output driver included in each of the first semiconductor chip and the second semiconductor chip shown in FIG. 1.

Referring to FIG. 3, the output driver may include a pre-driver block 310 and an output driver block 320.

The pre-driver block 310 generates a pull-up signal (not shown) and a pull-down signal (not shown) for controlling a data skew rate and a data duty cycle and transmits the signals to the output driver block 320.

The output driver block 320 may output data to a final output driver of the semiconductor chip through an input/output pad 10 PAD. However, since the driver size of the output driver block 320 is large, junction capacitance thereof may also be large to form a large part of the total capacitance of the pad. When output drivers having large junction capacitance are not independently supplied with a voltage, but supplied at once, parasitic capacitance occurring in the output drivers may increase, and thus the output speed of the data signals may decrease. Therefore, as the power supplied to the output driver included in each of the semiconductor chips is independently controlled, the parasitic capacitance occurring in the output driver may decrease.

The power supply voltage VCCQ and the ground voltage VSSQ supplied to the output driver may be the first output power supply voltages VCCQ_OUT1 and VSSQ_OUT1 or the second output power supply voltages VCCQ_OUT2 and VSSQ_OUT2 shown in FIG. 1, and the input/output pad IO PAD may be the first input/output pads 112a, 112b, ..., and 112n or the second input/output pads 122a, 122b, ..., and 122n shown in FIG. 1.

Figure 4:
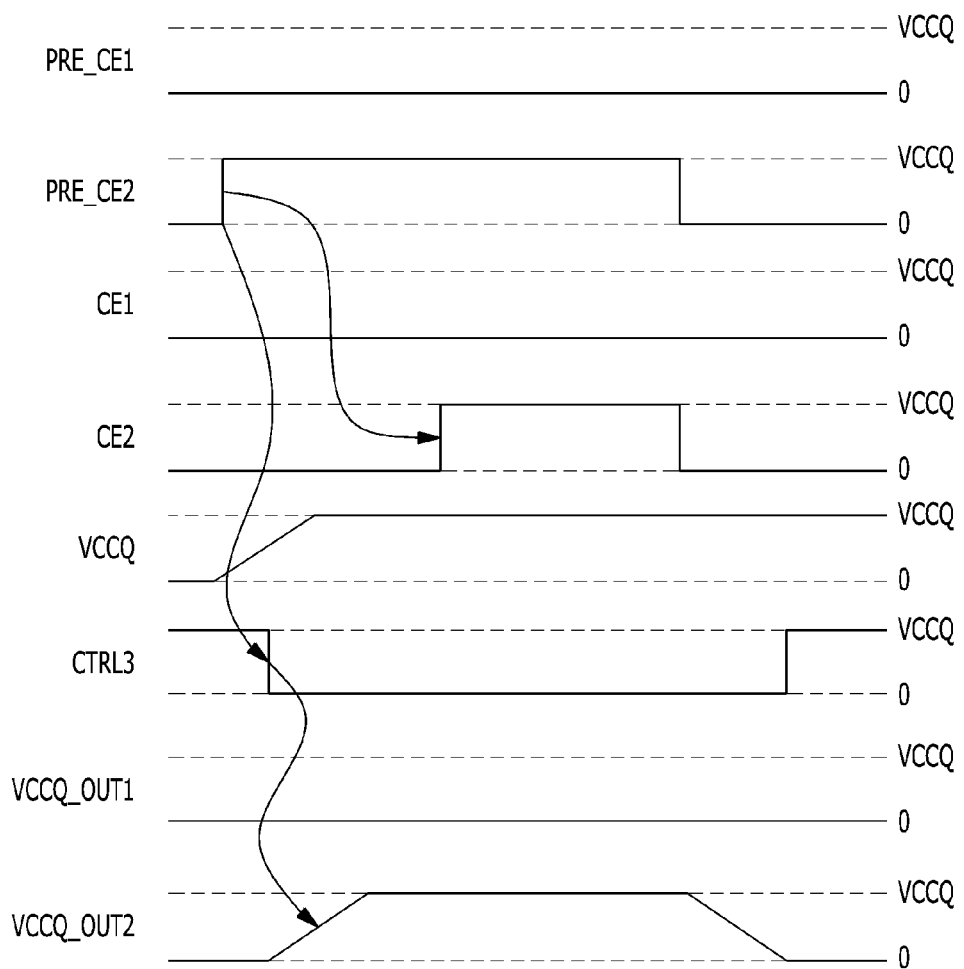
FIG. 4 is a timing diagram illustrating an independently controlled output power supplied voltage to an output driver of the stack package shown in FIG. 1.

FIG. 4 is a timing diagram illustrating that an output power supply voltage supplied to an output driver of the system-in-package shown in FIG. 1 is independently controlled.

Referring to FIGS. 1 to 4, when the second pre-chip enable signal PRE_CE2 is enabled, the controller 160 may supply the power supply voltage VCCQ to the first and second semiconductor chips 110 and 120. The power supply voltage VCCQ may be input through bonding wires. Consequently, the power supply voltage VCCQ may be supplied to data input/output circuits except for the output drivers included in the first and second semiconductor chips 110 and 120.

Subsequently, in order to enable the output driver of the second semiconductor chip 120, the control signal generation block 161_2 included in the controller 160 generates the third control signal CTRL3 for controlling the second output power supply voltage VCCQ_OUT2 in response to the second pre-chip enable signal PRE_CE2. Thus, when the third control signal CTRL3 is enabled, the power supply portion 162 included in the controller 160 supplies the second output power supply voltage VCCQ_OUT2 to the output driver of the second semiconductor chip 120. Consequently, the output driver of the second semiconductor chip 120 may be enabled. When the power is stabilized after the power is applied, and a predetermined time is passed, the rising delay block 161_1 included in the controller 160 delays a rising edge of the second pre-chip enable signal PRE_CE2 and enables the second chip enable signal CE2. The second semiconductor chip 120 may be substantially enabled in response to the second chip enable signal CE2. Thus, the output driver of the enabled second semiconductor chip 120 may be enabled and properly perform a data output operation. On the other hand, the first output power supply voltage VCCQ_OUT1 is cut off from the first semiconductor chip 110 where the data is not outputted, and thus the first chip enable signal CE1 is not enabled. In other words, the controller 160 may cut off the power from the output driver of the first semiconductor chip 110 where the data is not outputted among the first semiconductor chip 110 and the second semiconductor chip 120 through the control portion 161. Consequently, parasitic capacitance occurring due to a transistor of the output driver may decrease, and loading time for an output of the data may also decrease.

Although it is described as an example in an embodiment of the present invention that a power supply voltage supplied to output drivers included in a plurality of semiconductor chips that are stacked on one another is independently controlled, a power supply voltage of a plurality of fingers included in the output driver of a signal semiconductor chip may be independently controlled to reduce loading time.

In accordance with the embodiments of the present invention, a system-in-package may reduce loading time of a data input/output pad by selectively supplying power to output drivers of respective semiconductor chips based on whether data is outputted from the semiconductor chips and decreasing parasitic capacitance of the output drivers.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

What is claimed is:

1. A system-in-package, comprising:
   first and second semiconductor chips disposed in a first region over a substrate; and
   a controller disposed in a second region over the substrate and suitable for selectively supplying a power supply voltage to the first or second semiconductor chip based on a data output operation of the first and second semiconductor chips,
   wherein each of the first and second semiconductor chips includes:
   a first power supply region coupled with the controller through a first line and receiving the power supply voltage from the controller in common during an input/output operation of the first and second semiconductor chips;
   an output driver suitable for outputting data; and
   a second power supply region independently coupled with the controller through one of a second line and a third line and independently receiving the power supply voltage for an operation of the output driver from the controller during the data output operation of the first or second semiconductor chips.

2. The system-in-package of claim 1, wherein the controller includes:
   a control portion suitable for performing supply control to provide the first and second semiconductor chips with first and second chip enable signals and selectively supply the power supply voltage to the second power supply region of the first semiconductor chip or the second semiconductor chip; and
   a power supply portion suitable for selectively supplying the power supply voltage to the second power supply region of the first semiconductor chip or the second semiconductor chip under the supply control of the control portion.

3. The system-in-package of claim 2, wherein the control portion includes:
   a control signal generation block suitable for generating a control signal for performing the supply control to supply the power supply voltage to the first power supply region and the second power supply region in response to first and second pre-chip enable signals,
   wherein the control signal generation block includes:
      a first control signal generation unit suitable for generating a first control signal to supply the power supply voltage to the first power supply regions of the first and second semiconductor chips through the first line in common in response to the first or second pre-chip enable signal;
      a second control signal generation unit suitable for generating a second control signal to supply the power supply voltage to the second power supply region of the first semiconductor chip in response to the first pre-chip enable signal; and
      a third control signal generation unit suitable for generating a third control signal to supply the power supply voltage to the second power supply region of the second semiconductor chip in response to the second pre-chip enable signal.

4. The system-in-package of claim 3, wherein the first to third control signals maintain enabling sections for a predetermined time after the first and second pre-chip enable signals are disabled.

5. The system-in-package of claim 3, wherein the first to third control signals are enabled prior to the first and second chip enable signals.

6. The system-in-package of claim 3, wherein the control portion further includes:
   a rising delay block suitable for delaying rising edges of the first and second pre-chip enable signals and generating the first and second chip enable signals.

7. The system-in-package of claim 2, wherein each of the first and second chips further includes:
   a chip enable pad suitable for receiving a corresponding one of the first and second chip enable signals; and
   an input/output pad suitable for receiving and outputting the data.

8. The system-in-package of claim 7, wherein the chip enable pad is independently coupled with the controller through one of a fourth line and a fifth line, and
   the input/output pad is coupled with the controller through a sixth line.

9. The system-in-package of claim 7, wherein the second semiconductor chip is disposed over the first semiconductor chip, and wherein the chip enable pad, the input/output pad and the first power supply region of the first semiconductor chip are exposed.

10. The system-in-package of claim 7, wherein the number of the input/output pad correspond to the number of the data.

11. The system-in-package of claim 8, wherein the first to sixth lines electrically connect the first and second semiconductor chips to the controller.

12. The system-in-package of claim 7, wherein the output driver includes:
   a pre-driver block suitable for generating a pull-up signal and a pull-down signal for controlling a data skew rate and a data duty cycle; and
   an output driver block suitable for outputting the data through the input/output pad.

13. A stack package, comprising:
   first and second semiconductor chips stacked over a substrate,
   wherein the first semiconductor chip includes:
      a first chip enable pad suitable for receiving a first chip enable signal;
      a first input/output pad suitable for receiving and outputting data;
      a first output driver suitable for outputting the data; and
      a first output pad suitable for supplying a power supply voltage to the first output driver, and
   the second semiconductor chip includes:
      a second chip enable pad suitable for receiving a second chip enable signal;
      a second input/output pad suitable for receiving and outputting the data;
      a second output driver suitable for outputting the data; and
      a second output pad suitable for supplying the power supply voltage to the second output driver,
   wherein the first and second chip enable pads are separately coupled with an external device through a first line and a second line, respectively, and the first and second input/output pads are coupled with each other through a third line, and the first and second output pads are separately coupled with the external device through a fourth line and a fifth line, respectively.

14. The stack package of claim 13, wherein the second semiconductor chip is disposed over the first semiconductor chip, and wherein the first chip enable pad, the first input/output pad and the first output pad of the first semiconductor chip are exposed.

15. The stack package of claim 13, wherein the number of the first input/output pad and the number of the second input/output pad correspond to the number of the data.

16. The stack package of claim 13, wherein the first semiconductor chip further includes a first power supply pad for receiving the power supply voltage from the external device during an input/output operation of the data, and the second semiconductor chip further includes a second power supply pad for receiving the power supply voltage during the input/output operation of the data, and the first and second power supply pads are coupled with each other through a sixth line.

17. The stack package of claim 13, wherein the first and second output drivers independently operate based on the power supply voltage supplied through the first output pad or the power supply voltage supplied through the second output pad.

18. A stack package, comprising:
   a plurality of semiconductor chips stacked over a substrate,
   wherein each of the semiconductor chips includes:
      a chip enable pad suitable for receiving a chip enable signal;
      an input/output pad suitable for receiving and outputting data;
      an output driver suitable for outputting the data; and
      an output pad suitable for supplying a power supply voltage to the output driver,
      wherein the output pads included in the semiconductor chips are separately coupled with an external device through a plurality of lines, respectively.

19. The stack package of claim 18, wherein the semiconductor chips are stacked in tiers over the substrate.

20. The stack package of claim 18, wherein the number of the input/output pads corresponds to the number of the data.

21. A system-in-package, comprising:
   first and second semiconductor chips including first power supply regions, respectively, and including second power supply regions, respectively; and
   a controller suitable for supplying a power supply voltage to the first power supply regions in common during data input/output operations of the first and second semiconductor chips and independently supplying the power supply voltage to the second power supply regions during respective data output operations of the first or second semiconductor chips.

22. The system-in-package of claim 21, wherein the first power supply regions are coupled with the controller through a common line and the second power supply regions are separately coupled with the controller through respective lines.

* * * * *